United States Patent [19]

Greenwood et al.

[11] 4,131,985
[45] Jan. 2, 1979

[54] THIN SILICON DEVICES

[75] Inventors: John C. Greenwood; John M. Young, both of Harlow, England

[73] Assignee: ITT Industries, Inc., New York, N.Y.

[21] Appl. No.: 809,583

[22] Filed: Jun. 24, 1977

[30] Foreign Application Priority Data
Aug. 31, 1976 [GB] United Kingdom ...... 35977/76

[51] Int. Cl.² .............................................. B01J 17/00
[52] U.S. Cl. ...................... 29/580; 79/590; 156/628; 156/647; 156/649; 156/657; 156/662
[58] Field of Search ................ 29/580, 576 IW, 590, 29/589; 156/657, 662, 649, 628, 647

[56] References Cited
U.S. PATENT DOCUMENTS 3,571,919  3/1971  Gleim ..................................... 29/580
3,590,479  7/1971  Devries ................................... 29/580
4,070,230  1/1978  Stein ....................................... 29/580

*Primary Examiner*—W. Tupman
*Attorney, Agent, or Firm*—John T. O'Halloran; Peter C. Van Der Sluys

[57] ABSTRACT

This relates to a semiconductor device and method for making same. At least one semiconductor device is formed in a polished silicon slice, and the device is framed by a deep diffusion of boron. The surface of the slice is then coated with a layer of silicon nitride, and a glass ceramic body is bonded to the silicon nitride layer. The device is next isolated by isotropic etching, and the silicon from beneath the device is removed with a selective etch so that metal interconnections can be made to the underside of the device.

10 Claims, 3 Drawing Figures

THIN SILICON DEVICES

BACKGROUND OF THE INVENTION

This invention relates to a method of preparing a silicon semiconductor device which device is bonded to a glass ceramic or glass substrate.

SUMMARY OF THE INVENTION

According to the invention, there is provided a process for preparing a semiconductor device, including fabricating one or more devices on a polished silicon slice, framing each said device with a deep diffusion of boron, coating the surface of the slice with a layer of silicon nitride, bonding a glass or glass ceramic body to the silicon nitride layer, isolating the device by isotropic etching, and removing the silicon from the back of each device with a selective etch so as to expose the device.

According to the invention, there is further provided a semiconductor device structure, including a film of 111 silicon having semiconductor junctions formed therein, and a glass or glass ceramic body bonded to the silicon film via a layer of silicon nitride.

The devices are fabricated by known semiconductor processing techniques of 111 silicon slices which are then thinned down using a selective etch which etches the 111 plane at a slower rate than the other crystal planes.

BRIEF DESCRIPTION OF THE DRAWINGS

The invention will now be described in conjunction with the accompanying drawings in which.

DESCRIPTION OF THE PREFERRED EMBODIMENT

Figure 1:
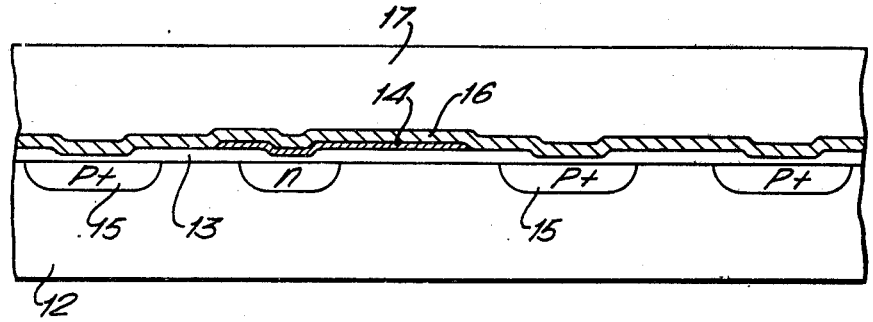
FIGS. 1 to 3 are cross-sections of a semiconductor device during successive stages in the device preparation.

Referring to FIG. 1, semiconductor devices are fabricated on a polished 111 silicon slice 12 in a manner known to those skilled in the art and are protected by a silicon dioxide coating 13. The surface interconnections 14 of the device are formed from polysilicon, and each device is surrounded, prior to the oxide coating, by a deep boron diffused frame 15. The surface of the silicon slice 12 is then coated with a layer 16 of silicon nitride.

A disc 17 of glass ceramic material, in its glass phase, is fused to the surface of the slice 12 via the silicon nitride layer and is devitrified to form a ceramic layer. The softening point of the glass should not exceed 1,200° C. to avoid excessive diffusion of the dopants in the silicon.

Figure 2:
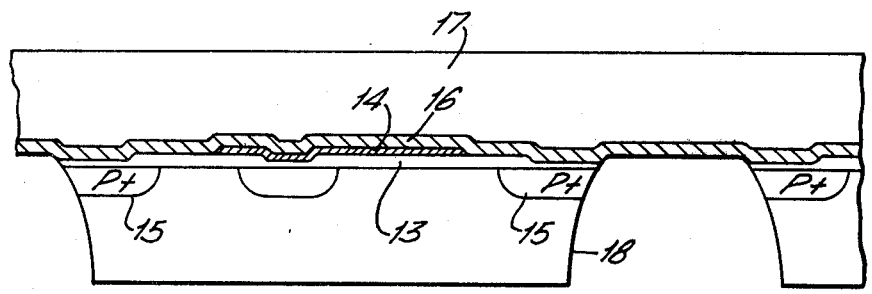
Figure 3:
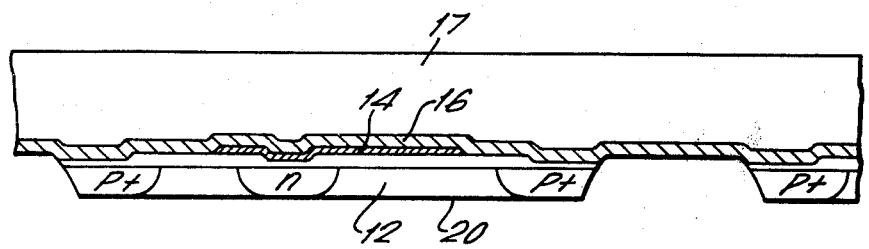

As shown in FIG. 2, holes 18 are etched from the back of the slice 12 through to the front at the corners of the semiconductor devices using a conventional isotropic etch with the aid of a mask. This process exposes the deep boron doped regions 15. The silicon slice 12 is then etched with a selective etch which acts sideways from the holes 18 but stops at the 111 face bounded by the boron doping 15. This stage is shown in FIG. 3.

The exposed silicon surface 20 is selectively oxidized and metal interconnections are made in the usual way except that they are now on the back of the device instead of the front.

In a further application the silicon slice 12 may be diced into chips prior to etching, the chips each being fused to a relatively larger area of glass ceramic. The chip is thinned down as before and the metallization is put on the back, but the pattern can now extend beyond the area of the silicon. This is of use when a large number of connections have to be made to the chip or where other thick or thin film components are to be incorporated.

The glass ceramic, which may be of the MgO or Li$_2$O together with Al$_2$O$_3$ and SiO$_2$ type is prepared by softening and moulding into a cylinder followed by rapid cooling through the crystallization temperature range. The cooled cylinder is cut into slices which are lapped and polished.

Each slice is placed face to face with a silicon slice and heated rapidly through the crystallization temperature to the softening point of the glass. The temperature is lowered, allowing time for a 'soak' in the crystallization temperature range to obtain substantially complete crystallization.

In some applications a glass, e.g. a borosilicate glass substrate or a ceramic substrate may be employed. Bonding to the semiconductor, i.e. to the silicon nitride layer, is effected via a layer of a solid glass.

What is claimed is:

1. A method of making a semiconductor structure, comprising:
   forming at least one semiconductor device on a surface of a polished silicon slice;
   framing said at least one device with a deep diffusion of boron;
   bonding a substrate to the surface of the polished silicon slice;
   isolating said at least one device by isotropic etching of the silicon slice about the boron diffused frame to form an isolating moat; and
   removing the silicon from beneath said at least one device using selective lateral etching of the silicon slice from the moat so as to expose said device.

2. A method of making a semiconductor structure including:
   forming at least one semiconductor device in the surface of a polished 111 silicon slice;
   framing said at least one device with a deep diffusion of boron;
   bonding a substrate to the surface of the polished silicon slice;
   isolating said at least one device by isotropic etching of said silicon slice around the boron diffused frame to form a moat; and
   removing silicon from beneath said at least one device utilizing selective lateral etching of the 111 silicon slice from the moat.

3. A method as described in claim 1, additionally comprising the step of coating the surface of said slice with a layer of silicon nitride prior to bonding the substrate to the surface of the polished silicon slice.

4. A method as described in claim 1, additionally comprising the step of forming metal interconnections to the underside of said at least one device after removing the silicon therefrom.

5. A method as described in claim 2, additionally comprising the step of forming metal interconnections to the underside of said at least one device after removing the silicon therefrom.

6. A method as described in claim 2, additionally including the step of coating the surface with a layer of silicon nitride prior to bonding the substrate to the surface of the polished silicon slice.

7. A method as described in claim 2, additionally comprising the step of forming polycrystalline silicon interconnectors to said device prior to framing said at least one device with a deep diffusion of boron.

8. A method of making a semiconductor structure including:
- forming at least one semiconductor device in the surface of a polished silicon slice;
- framing said at least one device with a deep diffusion of boron;
- coating the surface of said slice with a layer of silicon nitride;
- fusing the surface of said slice by way of said silicon nitride layer to a glass ceramic material in its glass phase;
- devitrifying said glass ceramic material to form a ceramic layer;
- isolating said at least one device by isotropic etching; and
- removing the silicon from beneath said at least one device with a selective etch so as to expose said device.

9. A method of making a semiconductor structure including:
- forming at least one semiconductor device in the surface of a polished 111 silicon slice;
- forming polycrystalline silicon interconnectors to said device;
- framing said at least one device with a deep diffusion of boron;
- coating said surface with a layer of silicon nitride;
- fusing the surface of said slice by way of said silicon nitride layer to a glass ceramic material in its glass phase;
- devitrifying said glass ceramic material to form a ceramic layer;
- isolating said at least one device by isotropic etching of said silicon slice around the boron diffused frame;
- removing silicon from beneath said at least one device with a selective etch; and
- forming metal interconnections to the underside of said at least one device.

10. A method of making a semiconductor structure including:
- forming at least one semiconductor device on the surface of a polished 111 silicon slice;
- framing said at least one device with a deep diffusion of boron;
- coating said surface with a layer of silicon nitride;
- fusing the surface of said slice by way of said silicon nitride layer to a glass ceramic material in its glass phase;
- devitrifying said glass ceramic material to form a ceramic layer;
- isolating said at least one device by isotropic etching of said silicon slice around the boron diffused frame; and
- removing silicon from beneath said at least one device with a selective etch.

* * * * *